United States Patent
Goto et al.

(10) Patent No.: US 9,752,899 B2
(45) Date of Patent: Sep. 5, 2017

(54) INDUCTIVE POSITION DETECTION DEVICE

(71) Applicant: AMITEQ CO., LTD., Tokyo (JP)

(72) Inventors: Daisuke Goto, Tokyo (JP); Kazuya Sakamoto, Tokyo (JP); Hiroshi Sakamoto, Saitama (JP); Yasuhiro Yuasa, Tokyo (JP)

(73) Assignee: AMITEQ CO., LTD., Tokyo (JP)

( * ) Notice: Subject to any disclaimer, the term of this patent is extended or adjusted under 35 U.S.C. 154(b) by 0 days.

(21) Appl. No.: 14/897,348

(22) PCT Filed: Jun. 13, 2014

(86) PCT No.: PCT/JP2014/065809
§ 371 (c)(1),
(2) Date: Dec. 10, 2015

(87) PCT Pub. No.: WO2014/200105
PCT Pub. Date: Dec. 18, 2014

(65) Prior Publication Data
US 2016/0131503 A1 May 12, 2016

(30) Foreign Application Priority Data

Jun. 13, 2013 (JP) .................................. 2013-125057

(51) Int. Cl.
*G01R 27/26* (2006.01)
*G01B 7/00* (2006.01)
(Continued)

(52) U.S. Cl.
CPC .......... *G01D 5/2258* (2013.01); *G01B 7/003* (2013.01); *G01D 5/2216* (2013.01);
(Continued)

(58) Field of Classification Search
CPC .. G01R 27/26; G01R 27/2611; G01D 5/2216; G01D 5/243; G01D 5/2258; G01D 5/2275; G01D 5/2291; G01B 7/003
(Continued)

(56) References Cited

U.S. PATENT DOCUMENTS 3,704,415 A * 11/1972 Yamanaka ............. G01R 17/06
324/117 R
4,804,913 A * 2/1989 Shimizu .................. F15B 15/28
324/207.23
(Continued)

FOREIGN PATENT DOCUMENTS

EP 0795738 A1 9/1997
GB 2195447 A 4/1988
(Continued)

OTHER PUBLICATIONS

International Search Report issued in PCT/JP2014/065809, mailed Oct. 7, 2014. English translation provided.
(Continued)

*Primary Examiner* — Hoai-An D Nguyen
(74) *Attorney, Agent, or Firm* — Rossi, Kimms & McDowell LLP (57) ABSTRACT

A coil section includes a primary coil which is magnetically excitable by an AC signal, and secondary coils which are provided so as to generate an inductive output in response to excitation of the primary coil. A self-oscillation circuit, including an inductance element and a capacitor, has incorporated therein the primary coil as the inductance element for self-oscillation. A target section is provided in such a manner that its relative position to the coil section varies according to a position of a target of detection, and the target section includes a magnetically responsive member disposed so that inductance of the secondary coils is varied according to the relative position. Amplitude levels of the
(Continued)

output signals of the secondary coils are extracted, and position data of the position of the target of detection is obtained on the basis of these amplitude levels.

13 Claims, 5 Drawing Sheets

(51) Int. Cl.
G01D 5/22 (2006.01)
G01D 5/243 (2006.01)

(52) U.S. Cl.
CPC ......... *G01D 5/2275* (2013.01); *G01D 5/2291* (2013.01); *G01D 5/243* (2013.01); *G01R 27/2611* (2013.01)

(58) Field of Classification Search
USPC ................ 324/600, 649, 652; 73/1.23, 1.79; 340/489, 991, 992, 993
See application file for complete search history.

(56) References Cited

U.S. PATENT DOCUMENTS

| | | | | |
|---|---|---|---|---|
| 5,353,906 | A * | 10/1994 | Takamisawa | G07D 5/08 194/319 |
| 5,903,205 | A | 5/1999 | Goto et al. | |
| 6,034,624 | A | 3/2000 | Goto et al. | |
| 2001/0052771 | A1* | 12/2001 | Jagiella | F15B 15/2846 324/207.16 |
| 2005/0040815 | A1* | 2/2005 | Jagiella | F15B 15/2892 324/207.15 |
| 2010/0085039 | A1* | 4/2010 | Goto | G01D 5/2013 324/207.18 |
| 2010/0177537 | A1* | 7/2010 | Kitamura | H02M 3/3385 363/21.02 |
| 2011/0304345 | A1* | 12/2011 | Hrubes | G01D 1/00 324/629 |
| 2014/0125422 | A1* | 5/2014 | Koyama | H03B 5/362 331/116 R |
| 2014/0347075 | A1* | 11/2014 | Goto | G01B 7/003 324/652 |

FOREIGN PATENT DOCUMENTS

| | | |
|---|---|---|
| JP | 0953909 A | 2/1997 |
| JP | 10153402 A | 6/1998 |
| JP | 10173437 A | 6/1998 |
| JP | 2001004309 A | 1/2001 |
| JP | 2002013906 A | 1/2002 |
| JP | 2010122012 A | 6/2010 |
| JP | 2011169823 A | 9/2011 |
| JP | 2011180958 A | 9/2011 |
| TW | 286366 B | 9/1996 |
| WO | 2007000952 A1 | 1/2007 |

OTHER PUBLICATIONS

Office Action issued in Chinese Appln. No. 201480033193.9, mailed Dec. 28, 2016. English translation provided.

Extended European Search Report issued in European Appln. No. 14811621.3 mailed Feb. 17, 2017.

Office Action issued in Chinese Patent Application No. 201480033193.9 mailed Jun. 6, 2017. English translation provided.

* cited by examiner

INDUCTIVE POSITION DETECTION DEVICE

TECHNICAL FIELD

The present invention relates generally to inductive type position detection devices which have an energizing or exciting primary coil incorporated therein as an inductance element of a self-oscillation circuit. The present invention relates more particularly to an inductive type position detection device in which primary and secondary coils comprise flat coils each formed in a spiral shape on a printed circuit board, in which the primary coil comprising the flat coil is incorporated as an inductance element of a self-oscillation circuit, and which is applicable to various desired types of position detection, such as in a minute displacement detection device, a linear position detection device, a rotational position detection device, an inclined position detection device, etc.

BACKGROUND ART

Heretofore, there have been known various types of position detection devices which employ a coil (inductance element) as a detection element. Many of such position detection devices include a dedicated AC signal source for energization or excitation of the coil, so that the coil is AC-excited by an AC signal generated from the AC signal source being applied to the coil. Examples of the conventionally-known inductive type position detection devices include ones disclosed in Patent Literature 1 and Patent Literature 2. The inductive type position detection devices disclosed in Patent Literature 1 and Patent Literature 2 include a primary coil and a secondary coil and are constructed in such a manner that the primary coil is excited by an AC signal and a secondary output signal responsive to the primary coil excitation is induced in the secondary coil. Further, in the inductive type position detection devices disclosed in Patent Literature 1 and Patent Literature 2, inductance of the secondary coil is varied in response to movement or displacement, relative to the secondary coil, of a magnetically responsive member (e.g., iron or copper) that is displaced in response to a position to be detected (i.e., position of a target of detection), so that an output signal corresponding to the position of the target of detection. In this case, an oscillation circuit that generates an AC signal for exciting the primary coil is provided separately from the coils. Also known are proximity sensors which can eliminate the need for, or dispense with, a dedicated exciting AC signal source by use of the principle of an LC oscillation circuit, i.e. by incorporating a coil, functioning as a detection element, in a self-oscillation circuit as an inductance element (see, for example, Patent Literature 3). Such self-oscillation type proximity sensors are advantageous in that they can be significantly reduced in size because the need for providing a dedicated exciting AC signal source can be eliminated. However, because the conventionally-known self-oscillation type proximity sensors are constructed to detect variation in oscillating frequency responsive to proximity of a target of detection, they require a frequency discrimination circuit. Further, although the conventionally-known self-oscillation type proximity sensors are constructed to be suited for detection of variation in oscillating frequency, they are not constructed to be capable of detecting a position of the target of detection on the basis of an amplitude level of an oscillation output signal.

If a challenge to reduction in size of the device construction is considered from another perspective, there can be employed an approach of using, as the detection element, a small flat coil formed in a spiral shape on a printed circuit board, one example of which is disclosed in Patent Literature 2. In position detection devices using such a flat coil, the number of winding turns of the coil is so small that it is difficult to obtain a sufficient magnetic flux for detection. To make up for or supplement such an insufficient magnetic flux, a device disclosed in Patent Literature 4 employs a technique of providing the flat coil in multiple layers.

PRIOR ART LITERATURE

Patent Literature 1: Japanese Patent Application Laid-open Publication No. HEI-9-53909
Patent Literature 2: Japanese Patent Application Laid-open Publication No. HEI-10-153402
Patent Literature 3: Japanese Patent Application Laid-open Publication No. HEI-10-173437
Patent Literature 4: Japanese Patent Application Laid-open Publication No. 2010-122012

SUMMARY OF INVENTION

It is therefore an object of the present invention to achieve a simplified overall construction and reduced size of an inductive type position detection device employing primary and secondary coils. It is another object of the present invention to further simplify the construction of the inductive type position detection device by employing, as a detection element, a flat coil formed in a spiral shape on a printed circuit board and supplement magnetic flux that tends to become insufficient.

In order to accomplish the above-mentioned object, an inductive type position detection device of the present invention comprises: a coil section including a primary coil excitable by an AC signal and a secondary coil disposed to produce an induced output in response to excitation of the primary coil; a self-oscillation circuit composed of the primary coil included in the coil section and a capacitor, the self-oscillation circuit having incorporated therein the primary coil as an inductance element for self-oscillation; a target section disposed in such a manner that a position of the target section relative to the coil section varies in response to a position of a target of detection, the target section being formed of a magnetically responsive member constructed to vary inductance of the secondary coil in the coil section in response to the position of the target section relative to said coil section; and output circuitry for outputting position data of the target of detection based on an amplitude level of an output signal of the secondary coil.

Because the primary coil is incorporated in the self-oscillation circuit as an inductance element for self-oscillation as noted above, the present invention can simplify the construction of the exciting self-oscillation circuit. Further, because the present invention is an inductive type detection device using the primary and secondary coils, it can take out output levels with an enhanced efficiency and thereby perform accurate position detection as compared to a variable impedance type detection device including only a primary coil.

Further, in the present invention, the oscillating frequency of the self-oscillation circuit is preferable set at a high frequency band of hundreds of kHz or more, so that a variation width (dynamic range) amplitude levels of DC voltage signals, obtained by rectifying oscillated output signals from the self-oscillation circuit, can be increased. Thus, the present invention permits position detection through simple amplitude level discrimination using a rectifier circuit etc., rather than frequency discrimination.

As an example, the primary and secondary coils may each comprise a flat coil formed in a spiral shape on a printed circuit board. Namely, because output gains can be increased with the present invention, the present invention can not only advantageously employ an even further simplified construction by using, as the primary and secondary coils, the flat coils each formed in a spiral shape on the printed circuit board but also supplement magnetic flux that tends to become insufficient in such a case. Particularly, because the present invention is an inductive type detection device using the primary and secondary coils, it can take out output levels with an enhanced efficiency and thereby perform accurate position detection as compared to a variable impedance type detection device including only a primary coil, and thus, the present invention is suited for use of the flat coils.

As an example, in the present invention, the secondary coil may comprise at least one pair of secondary coils that are disposed spaced from each other by a predetermined interval, the target section may be constructed in such a manner that inductance variation of individual ones of the pair of secondary coils presents mutually-opposite characteristics, and output signals of the pair of secondary coils may be differentially synthesized to generate a single synthesized output signal.

BRIEF DESCRIPTION OF DRAWINGS

FIGS. 4(a), 4(b), 4(c), and 4(d) are diagrams showing an example of the inductive type position detection device of the present invention constructed as a rotational position detection device, where

FIGS. 5(a), 5(b), and 5(c) are perspective views showing some of structural elements of the rotor section and the stator section shown in FIGS. 4(a), 4(b), 4(c), and 4(d), where

DESCRIPTION OF EMBODIMENTS

Figure 1:
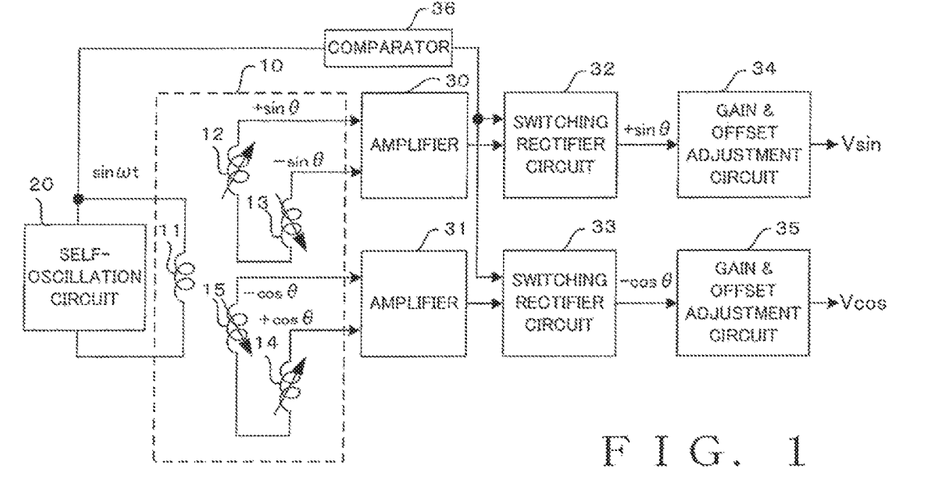
FIG. 1 is a circuit diagram showing an example circuitry construction of an embodiment of an inductive type position detection device of the present invention.

FIG. 1 is a circuit diagram showing an example circuit construction of an inductive type position detection device according to an embodiment of the present invention. As shown in FIG. 1, a coil section 10 includes a primary coil 11 excitable by an AC signal sin ωt, and four secondary coils 12 to 15 that are each disposed to produce an induced output in response to excitation of the primary coil 11. The primary coil 11 is incorporated in a self-oscillation circuit 20 as a variable inductance element, and the primary coil 11 is disposed in such a manner that it not only contributes to self-oscillation but also causes an induced voltage to be produced in each of the secondary coils 12 to 15 in response to an AC magnetic field produced by the coil 11. Each of the coils 11 to 15 is, for example, in the form of a flat coil formed in a spiral shape on a printed circuit board. The use of such flat coils significantly contributes to downsizing or size reduction of the device construction. In this case, the flat coils 11 to 15 may each comprise a plurality of flat coil portions disposed in superposed multi-layers are connected in series with each other. Such arrangements can increase inductance. Note, however, that the coils 11 to 15 may each be in the form of a wire-wound type coil rather than a flat coil.

Figure 2A:
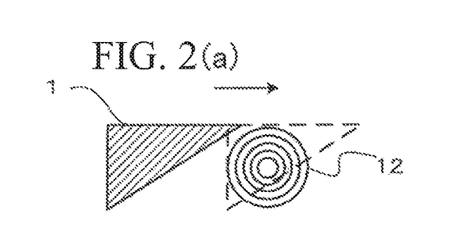
FIGS. 2(a) and 2(b) are schematic diagrams showing example relationship between one secondary coil and a target section in the embodiment of the inductive type position detection device of the present invention.

Further, as illustratively shown in FIG. 2(a), the inductive type position detection device of the invention includes, as another position detection element, a target section 1 provided in such a manner that the target section 1 can be moved or displaced relative to each of the secondary coils 12 to 15 of the coil section 10. More specifically, the target section 1 is disposed so that it is displaced in response to movement of a not-shown target of detection in such a manner that its relative position to the secondary coils 12 to 15 of the coil section 10 is varied. Further, the target section 1 is formed of a magnetically responsive substance ("magnetically responsive substance" is a term defining, in the broadest sense, a substance, such as a magnetic or conductive material, that varies in reluctance or magnetic resistance in response to magnetism, i.e. magnetic flux) shaped in such a manner as to change the inductance of each of the secondary coils 12 to 15 in response to the relative position of the target section 1. As an example, the magnetically responsive substance forming the target section 1 is a non-magnetic, good electrically conductive substance, such as copper or aluminum. Further, the magnetically responsive substance forming the target section 1 may be of a shape such that at least one of an area of the target section 1 opposed to the secondary coils 12 to 15 and a gap between the target section 1 and the secondary coils 12 to 15 varies in response to variation in the relative position of the target section 1 to the secondary coils 12 to 15. Note that the basic principles of the present invention are applicable to any forms of movement of the target of detection, such as linear displacement, rotational displacement, swinging displacement and inclination (arcuate displacement). Further, the target section 1 may be of any shape and mechanical construction known in the field of inductive or variable-magnetic-resistance type position detection devices.

Figure 2B:
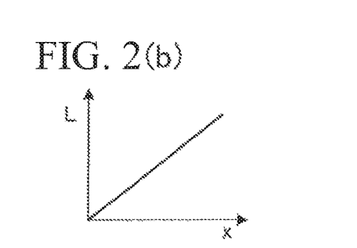

FIG. 2 (b) is a graph showing an example of variation in the inductance L of one of the secondary coils 12 responsive to the relative position of the target section 1 to the secondary coil 12 (linear position x or rotational position θ). Whereas this figure shows an example where the variation of the inductance L is of a linear characteristic, the present invention is not so limited, and the variation of the inductance L may be of a desired non-linear characteristic, such as a sine characteristic or cosine characteristics, as will be described later.

Figure 3:
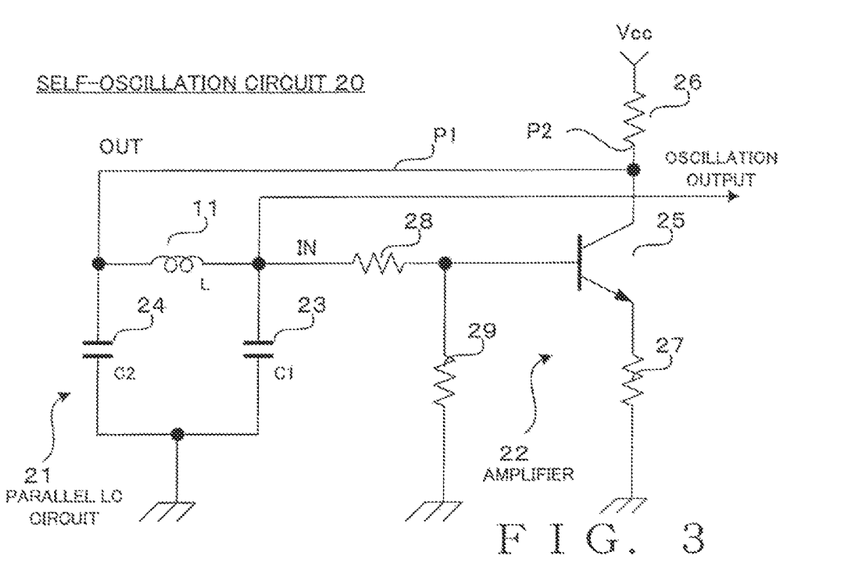
FIG. 3 is a circuit diagram showing an example of a self-oscillation circuit in the embodiment.

FIG. 3 shows an example of the self-oscillation circuit 20 where the primary coil 11 is incorporated as a self-oscillating inductance element. Here, the self-oscillation circuit 20 is a Colpitts type oscillation circuit comprising a parallel LC circuit 21 and an amplifier 22. The parallel LC circuit 21 comprises the primary coil 11 that functions as an inductive exciting coil, and capacitors 23 and 24. The amplifier 22 includes: a transistor 25 as an amplifying element; a resistor 26 between a power supply and the collector, a resistor 27 between the emitter and the ground; and base-voltage setting resistors 28 and 29. Note that the amplifying element may be implemented by any desired inverting amplifying element, such as an FET or operational amplifier without being limited to the transistor. A signal from a connection point between one of the capacitors 23 and the coil 11 of the parallel LC circuit 21 is input to an input terminal IN (base input) of the amplifier 22, and an output terminal OUT (collector output) of the amplifier 22 is coupled to a connection point between the other capacitor 24 and the coil 11 of the parallel LC circuit 21. In the illustrated example of FIG. 3, an oscillation output signal can be taken out from the input terminal IN (base input) of the amplifier 22. Also note that the fundamental construction of the self-oscillation circuit 20 is not limited to the Colpitts type oscillation circuit as shown in the figure and may be a Hartley type oscillation circuit.

The resonant frequency of the self-oscillation circuit 20 may be set at a high frequency band (e.g., hundreds of kHz or more). In the case where the resonant frequency of the self-oscillation circuit 20 is set at such a high resonance frequency, a sufficient gain can be secured if each of secondary coil output signals induced in response to the high exciting frequency of the primary coil is converted into a DC voltage by a rectifier circuit, which is therefore advantageous. Particularly, in the case where flat coils formed on the printed circuit board are used, securing a high gain by setting the exciting frequency relatively high can operate extremely advantageously, because it is not possible to secure a great number of windings in that case.

Further, in the illustrated example of FIG. 1, the four secondary coils 12 to 15 in the coil section 10 are disposed to present inductance variation of a plus sine characteristic $+\sin\theta$, a minus sine characteristic $-\sin\theta$, a plus cosine characteristic $+\cos\theta$ and a minus sine characteristic $-\cos\theta$, respectively. Namely, the four secondary coils 12 to 15 are disposed sequentially displaced from one another at predetermined intervals in such a manner that, if the periodic characteristic of the inductance variation of the secondary coil 12 is a plus sine function characteristic as indicated by $A(\theta)$ below, the periodic characteristics of the inductance variation of the other secondary coils 13 to 15 assume the following relationship as indicated by $B(\theta)$, $C(\theta)$ and $D(\theta)$ blow.

$A(\theta)=P_0+P \sin\theta$ (secondary coil 12)

$B(\theta)=P_0+P \cos\theta$ (secondary coil 14)

$C(\theta)=P_0-P \sin\theta$ (secondary coil 13)

$D(\theta)=P_0-P \cos\theta$ (secondary coil 15), where $P_0$ indicates a swing center of the inductance variation, and P indicates a swing amplitude. Because P may be regarded as a value "1", it will be omitted in the following description.

In the present invention, the secondary coils 12b to 15 in the coil section are combined in pairs each comprising two coils. The two coils of each of the pairs are set so that their respective inductance variation relative to the target of detection presents characteristics of mutually opposite phases. More specifically, the secondary coil 12 of the $+\sin$ characteristic (plus sine phase) and the secondary coil 13 of the $-\sin$ characteristic (minus sine phase) constitute one pair, while the secondary coil 14 of the $+\cos$ characteristic (plus cosine phase) and the secondary coil 15 of the $-\cos$ characteristic (minus cosine phase) constitute the other pair.

The two coils 12 and 13 of the opposite sine characteristics are interconnected differentially, and differential composite output signals from the two coils 12 and 13 are input to an amplifier 30 so that a difference between the differential composite output signals, i.e. $A(\theta)-C(\theta)=+2 \sin\theta \sin\omega t$ is obtained. In this, way, a temperature-compensated detection output signal of the sine characteristic can be obtained. Likewise, the two coils 14 and 15 of the opposite cosine characteristics are interconnected differentially, and differential composite output signals from the coils 14 and 15 are input to an amplifier 31 so that a difference between the differential composite output signals, i.e. $D(\theta)-B(\theta)=-2 \cos\theta \sin\omega t$ is obtained. In this, way, a temperature-compensated detection output of the cosine characteristic can be obtained.

An oscillation output signal of the self-oscillating circuit 20 is input to a comparator 36 so that it is converted to a square wave. This is for the purpose of detecting a predetermined phase (e.g., 0 or 180 degrees) of the exciting AC signal. An output of the comparator 36 is input to switching rectifier circuits 32 and 33 as a sampling signal and a trigger signal, so that, in the switching rectifier circuits 32 and 33, amplitude values of a position detection AC output signals $+\sin\theta \sin\omega t$ and $-\cos\theta \sin\omega t$ are sampled and held. In this way, the position detection AC output signals $+\sin\theta \sin\omega t$ and $-\cos\theta \sin\omega t$ are rectified, so that DC voltages $+\sin\theta$ and $-\cos\theta$ corresponding to a detected position $\theta$ can be obtained. Respective outputs from the switching rectifier circuits 32 and 33 are not only adjusted in gain by gain and offset adjustment circuits 34 and 35 but also offset-adjusted by the gain and offset adjustment circuits 34 and 35 adding (or subtracting) predetermined offset voltages to or from the outputs, with the result that position detection DC voltage signals V sin and V cos can be obtained. Namely, the position detection DC voltage signal V sin output from the gain and offset adjustment circuit 34 is a DC voltage signal indicative of variation of the sine characteristic $+\sin\theta$ corresponding to the position $\theta$ of the target of detection, and the position detection DC voltage signal V cos output from the gain and offset adjustment circuit 35 is a DC voltage signal indicative of variation of the cosine characteristic $-\cos\theta$ corresponding to the position $\theta$ of the target of detection. If the variation in the position $\theta$ of the target of detection is within a range of $\pi/2$ radians, the position $\theta$ of the target of detection can be identified from only one of the two position detection DC voltage signals V sin and V cos. Further, if the variation in the position $\theta$ of the target of detection is within a range of $2\pi$ radians, the position $\theta$ of the target of detection can be identified as an absolute position from a combination of the two position detection DC voltage signals V sin and V cos. Such position detection DC voltage signals V sin and V cos can be used directly as analog signals or after being converted into digital values. Circuits like the above-mentioned amplifiers 30 and 31, switching rectifier circuits 32 and 33, gain and offset adjustment circuits 34 and 35, etc. function as output circuitry that extracts amplitude levels of output signals of the secondary coils 12 to 15 and outputs the extracted amplitude levels as position data of the target of detection.

FIG. 4 is a diagram showing an example of the inductive type position detection device of the present invention constructed as a rotational position detection device. More specifically, FIG. 4 shows an inductive type multi-rotational position detection device that is capable of detecting absolute positions over a multiplicity of rotations. FIG. 4(a) is an axial sectional view of the inductive type multi-rotational position detection device. A first rotational position detection device 50 is disposed on a main rotation shaft 40 that is an target of detection and that is given rotational displacement, and a second rotational position detection device 60 is disposed on an auxiliary shaft 41 rotatably supported by a not-shown sensor casing. The first rotational position detection device 50 and the second rotational position detection device 60 are each an inductive type rotational position detection device constructed in accordance with the concept or principles of the present invention.

Figure 4A:
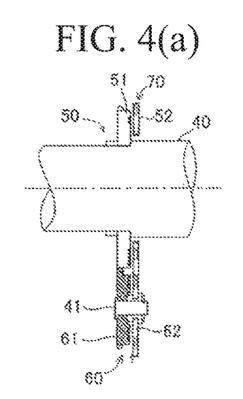
FIG. 4(a) is an axial sectional view of the inductive type rotational position detection device.
Figure 4B:
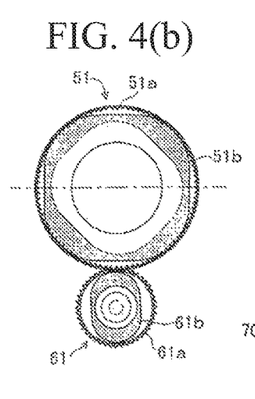
FIG. 4(b) is a front view of a rotor section.

The first rotational position detection device 50 includes a rotor section 51 and a stator section 52. The rotor section 51 is fixedly mounted on the main rotation shaft 40 so that it rotates together with the main rotation shaft 40. The stator section 52 is incorporated in a sensor substrate 70, and the sensor substrate 70 is fixed to the not-shown sensor casing. FIG. 4(b) is a front view of the rotor section 51 as viewed from the sensor substrate 70 (i.e., from the stator section 52). A gear 51a is formed along the circumference of the rotor section 51, and a pattern of a magnetically responsive member 51b (e.g., a non-magnetic, good electrically conductive substance like copper or aluminum, or a magnetic substance like iron) is formed on a surface of the rotor section 51 facing the sensor substrate 70 (i.e., stator section 52). The magnetically responsive member 51b functions as the above-mentioned target section 1. As an example, the pattern of the magnetically responsive member 51b is constructed to present four cycles of sine function characteristic variation per rotation of the main rotation shaft 40. Note that FIG. 5(a) extractively shows in a perspective view the pattern of the magnetically responsive member 51b.

Figure 4C:
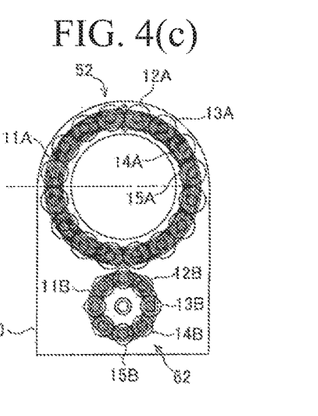
FIG. 4(c) is a perspective front view showing a stator section with a sensor substrate.
Figure 4D:
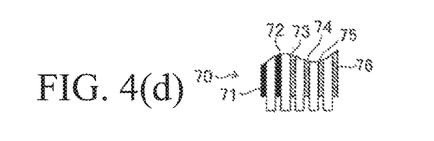
FIG. 4(d) is an enlarged sectional view schematically showing a part of the sensor substrate.

Further, FIG. 4(c) is a front view showing in perspective the stator section 52 incorporated in the sensor substrate 70, and FIG. 4(d) is an enlarged sectional view schematically showing a part of the sensor substrate 70 comprising a multiplicity of substrate layers. The sensor substrate 70 is composed of six flat coil layer 71 to 76. The flat coil layer 71 to 76 are partitioned off from one another by insulating layers. In the stator section 52, one primary coil 11A is provided in correspondence with the entire circumference of the magnetically responsive member 51b. The primary coil 11A corresponds to the primary coil 11 shown in FIG. 1. More specifically, in two of the flat coil layers 71 and 72, two flat coils (printed coils) for the primary coil 11A are each wound in a spiral shape and in a same layout. The two flat coils (printed coils) are connected in series with each other to constitute the primary coil 11A and incorporated (as the primary coil 11) in the self-oscillating circuit 20 of FIG. 3. Note that FIG. 5(b) extractively shows in a perspective view only the flat coil layer 71.

Further, in the stator section 52, four secondary coils 12A, 13A, 14A and 15A are sequentially arranged, at equal intervals (of 22.5 degrees for instance) within a 90-degree range in a circumferential direction of the stator section 52, in correspondence with the magnetically responsive member 51b of the rotor section 51. The secondary coils 12A, 13A, 14A and 15A correspond to the secondary coils 12 to 15 shown in FIG. 1. More specifically, in the four flat coil layers 73, 74, 75 and 76, the flat coils (printed coils) for the four secondary coils 12A, 13A, 14A and 15A are each formed in a spiral shape and in a same layout, and corresponding ones of the flat coils (printed coils) are connected in series to constitute the secondary coils 12A, 13A, 14A and 15A. Note that FIG. 5(c) extractively shows in a perspective view only the flat coil layer 73.

Further, in the stator section 52, three sets of secondary coils, each constructed in the same manner as the above-mentioned four secondary coils 12A, 13A, 14A and 15A in the form of the flat coils, are arranged in the remaining range of 270 degrees along the circumferential direction of the stator section 52 in correspondence with the magnetically responsive member 51b of the rotor section 51. Thus, a total of four sets of secondary coils 12A, 13A, 14A and 15A are provided in the stator section 52. Of these four sets of secondary coils, the secondary coils (flat coils) presenting the same inductance variation characteristic in response to displacement of the magnetically responsive member 51b of the rotor section 51 are connected in series, so that four output signals of the secondary coils can be obtained in the same manner as shown in FIG. 1. More specifically, composite output signals of the secondary coils 12A correspond to the output signal of the secondary coil 12 shown in FIG. 1, composite output signals of the secondary coils 13A correspond to the output signal of the secondary coil 13 shown in FIG. 1, composite output signals of the secondary coils 14A correspond to the output signal of the secondary coil 14 shown in FIG. 1, and composite output signals of the secondary coils 15A correspond to the output signal of the secondary coil 15 shown in FIG. 1, Thus, detection circuitry constructed similarly to the circuit shown in FIG. 3 can be applied for the aforementioned first rotational position detection device 50 that includes the rotor section 51 and the stator section 52. In this case, position detection DC voltage signals V sin and V cos obtained by the first rotational position device 50 present four cycles of variation per rotation of the main rotation shaft 40 that is the target of detection. Namely, the position detection DC voltage signals V sin and V cos indicate an absolute position detection value for the 90-degree rotation range of the main rotation shaft 40.

Figure 5A:
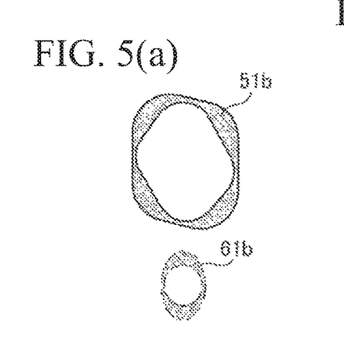
FIG. 5(a) is a perspective view extractively showing a pattern of a magnetically responsive member of the rotor section.

In FIG. 4, the second rotational position detection device 60 too includes a rotor section 61 and a stator section 62. The rotor section 61 is fixedly mounted on an auxiliary rotation shaft 41 so that it rotates together with the auxiliary rotation shaft 41. Like the above-mentioned stator section 52, the stator section 62 is incorporated in the sensor substrate 70. As shown in FIG. 4(b), a gear 61a is formed in and along the circumference of the rotor section 61, and a pattern of a magnetically responsive member 61b (e.g., non-magnetic, good electrically conductive substance like copper or aluminum, or magnetic substance like iron) is formed on a surface of the rotor section 61 facing the sensor substrate 70 (i.e., stator section 62). The magnetically responsive member 61b functions as the above-mentioned target section 1. As an example, the pattern of the magnetically responsive member 61b is constructed to present two cycles of sine function characteristic variation per rotation of the auxiliary rotation shaft 41. The gear 61a of the rotor section 61 is held in meshing engagement with the gear 51a of the rotor section 51 of the above-mentioned first rotational position detection device 50, so that the rotation of the main rotation shaft 40 is transmitted to the auxiliary rotation shaft 41 after speed multiplication. A combination of the above-mentioned main rotation shaft 40, gears 51*a* and 61*a* and auxiliary rotation shaft 41 constitutes a transmission means that transmits rotational movement or displacement of the target of detection to the first and second rotational position detection devices 50 and 60 with different transmission ratios. Note that FIG. 5(*a*) extractively shows in a perspective view the pattern of the magnetically responsive member 61*b*.

In the stator 62, as shown in FIGS. 4(*c*) and 5(*b*), one primary coil 11B is provided in correspondence with the entire circumference of the magnetically responsive member 61*b*. The primary coil 11B corresponds to the primary coil 11 shown in FIG. 1. More specifically, in the two flat coil layers 71 and 72, two flat coils (printed coils) for the primary coil 11B are each formed in a same layout. The two flat coils (printed coils) are connected in series with each other to constitute the single primary coil 11B and incorporated (as the primary coil 11) in the self-oscillating circuit 20 of FIG. 3. Note that the self-oscillation circuit 20 and the other detecting circuits are of course possessed by, i.e. provided in, each of the first and second rotational position detection devices 50 and 60.

Figure 5B:
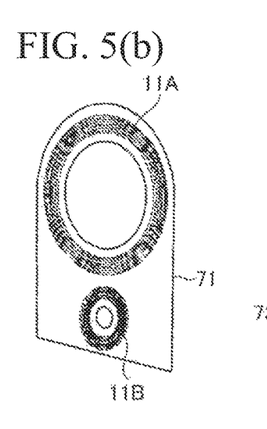
FIG. 5(b) is a perspective view showing flat coil layers constituting primary coils in the stator section.
Figure 5C:
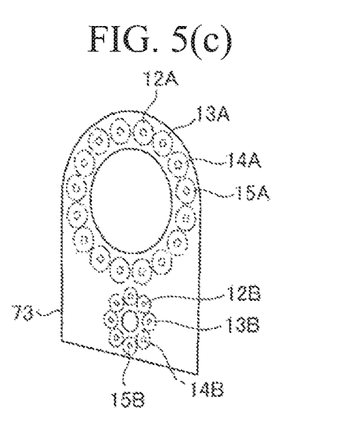
FIG. 5(c) is a perspective view showing flat coil layers constituting secondary coils in the stator section.

Further, in the stator section 62, as shown in FIGS. 4(*c*) and 5(*c*), four secondary coils 12B, 13B, 14B and 15B are sequentially arranged, at equal intervals (of 45 degrees) within a 180-degree range in a circumferential direction of the stator section 62, in correspondence with the magnetically responsive member 61*b* of the rotor section 61. The secondary coils 12B, 13B, 14B and 15B correspond to the secondary coils 12 to 15 shown in FIG. 1. More specifically, in the four flat coil layers 73, 74, 75 and 76, flat coils (printed coils) for the four secondary coils 12B, 13B, 14B and 15B are each formed in a same layout, and corresponding ones of the flat coils (printed coils) are connected in series to constitute the secondary coils 12B, 13B, 14B and 15B.

Further, in the stator section 62, another set of secondary coils, constructed in the same manner as the above-mentioned four secondary coils 12A, 13A, 14A and 15A in the form of the flat coils, is arranged in the remaining 180-degree range along the circumferential direction of the stator section 62 in correspondence with the magnetically responsive member 61*b* of the rotor section 61. Thus, a total of two sets of secondary coils 12B, 13B, 14B and 15B are provided in the stator section 62. Of these two sets, the secondary coils (flat coils) presenting the same inductance variation characteristic in response to displacement of the magnetically responsive member 61*b* of the rotor section 61 are connected in series with each other, so that four output signals of the secondary coils 12 to 15 can be obtained in the same manner as shown in FIG. 1. Namely, composite output signals of the secondary coils 12B correspond to the output signal of the secondary coil 12 shown in FIG. 1, composite output signals of the secondary coils 13B correspond to the output signal of the secondary coil 13 shown in FIG. 1, composite output signals of the secondary coils 14B correspond to the output signal of the secondary coil 14 shown in FIG. 1, and composite output signals of the secondary coils 15B correspond to the output signal of the secondary coil 15 shown in FIG. 1.

Thus, detection circuitry constructed similarly to the circuit shown in FIG. 3 can be applied for the aforementioned second rotational position detection device 60 that includes the rotor section 61 and the stator section 62. In this case, position detection DC voltage signals V sin and V cos obtained by the detection device 60 present two cycles of variation per rotation of the auxiliary rotation shaft 41, but the position detection DC voltage signals V sin and V cos vary in a non-integral number of cycles, with a gear ratio between the gears 51*a* and 61*a* taken into account, per rotation of the main rotation shaft 40.

The gear ratio between the gears 51*a* and 61*a* etc. are set such that the second rotational position detection device 60 presents detection values of less than one cycle with respect to a range of one cycle of detection value variation of the first rotational position detection device 50 (i.e., 90-degree variation range of the main rotation shaft 40 within which absolute positions can be detected by the first rotational position detection device 50). For example, the gear ratio etc. are set such that, if the maximum detection value of the first rotational position detection device 50 corresponding to the 90-degree variation of the main shaft 40 is assumed to be "D", the detection value of the first rotational position detection device 50 becomes a value, such as "D−1" (represented as a digital value for convenience), that is slightly different from the value "D". Thus, a difference or ratio between the detection value of the first rotational position detection device 50 and the detection value of the second rotational position detection device 60 will indicate the number of cycles of detection values of the first rotational position detection device 50, and detection of absolute positions over a multiplicity of rotations (more particularly, for more than a one-cycle range of the first rotational position detection device 50) is permitted.

Figure 6:
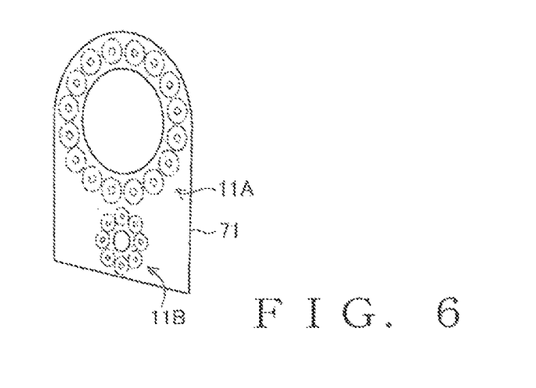
FIG. 6 is a perspective view showing a modification of a layout of the primary coils shown in FIG. 5(b).

As a modification of the embodiment shown in FIG. 1, a plurality of primary coils 11 may be provided in corresponding relation to the secondary coils 12 to 15, and these primary coils 11 may be connected in series with each other and incorporated as inductance elements in the self-oscillation circuit 20. In such a case, the flat coil layer 71 (and flat coil layer 72) for the primary coils shown in FIG. 5(*b*) are modified as shown in FIG. 6. Namely, 16 (sixteen) primary coils 11A are provided in the first rotational position detection device 50 in a layout corresponding to that of the 16 secondary coils 12A to 15A, and these primary coils 11A are connected in series and incorporated as inductance elements 11 in the self-oscillation circuit 20. Further, 8 (eight) primary coils 11B are provided in the second rotational position detection device 60 in a layout corresponding to that of the eight secondary coils 12B to 15B, and these primary coils 11B are connected in series and incorporated as inductance elements 11 in the self-oscillation circuit 20.

Figure 7:
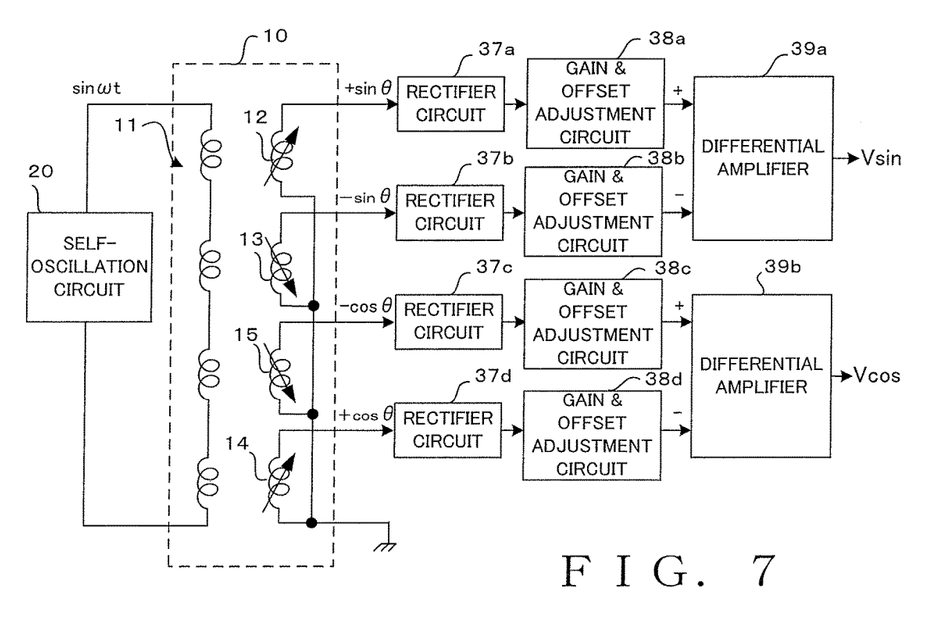
FIG. 7 is a circuit diagram showing another example circuit construction of the inductive type position detection device according to the present invention.

FIG. 7 is a circuit diagram showing another example circuit construction of the inductive type position detection device according to the present invention. In this embodiment of the invention, a plurality of primary coils 11 are provided in corresponding relation to the secondary coils 12 to 15 and these primary coils 11 are connected in series and incorporated as inductance elements in the self-oscillation circuit 20, in the same manner as in the above-described modification. Outputs of the secondary coils 12 to 15 are input to rectifier circuits 37*a* to 37*d*, respectively, so that DC voltages corresponding to amplitude components $+\sin \theta$, $-\sin \theta$, $-\cos \theta$ and $+\cos \theta$ are obtained. Outputs of the rectifier circuits 37*a* to 37*d* are input to gain and offset adjustment circuits 38*a* to 38*d*, respectively, so that the outputs of the rectifier circuits 37*a* to 37*d* are not only adjusted in gain by the gain and offset adjustment circuits 38*a* to 38*d* but also offset-adjusted by the gain and offset adjustment circuits 38*a* to 38*d* adding (or subtracting) predetermined offset voltages to or from the outputs of the rectifier circuits 37*a* to 37*d*. The DC voltages of the amplitude components +sin θ and −sin θ of the sine characteristic output from the gain and offset adjustment circuits 38a and 38b are synthesized differentially to obtain a temperature-compensated position detection DC voltage signal V sin of the sine characteristic. Further, the DC voltages of the amplitude components −cos θ and +cos θ of the cosine characteristic output from the gain and offset adjustment circuits 38c and 38d are synthesized differentially to obtain a temperature-compensated position detection DC voltage signal V cos of the cosine characteristic. In a case where an inductive type multi-rotational position detection device as shown in FIG. 4 is constructed in accordance with the principles of the embodiment of FIG. 7, the flat coil layer 71 (and flat coil layer 72) for the primary coils shown in FIG. 5(b) are modified as shown in FIG. 6. The flat coil layer 73 (and flat coil layers 74 to 76) for the secondary coils shown in FIG. 5(c) are not modified. The constructions of the rectifier circuits 37a to 37d, gain and offset adjustment circuits 38a to 38d and differential amplifiers 12 to 15 are also applicable to the case where the single primary coil 11 is used for (shared among) the secondary coils 12 to 15 as shown in FIG. 1.

Figure 8:
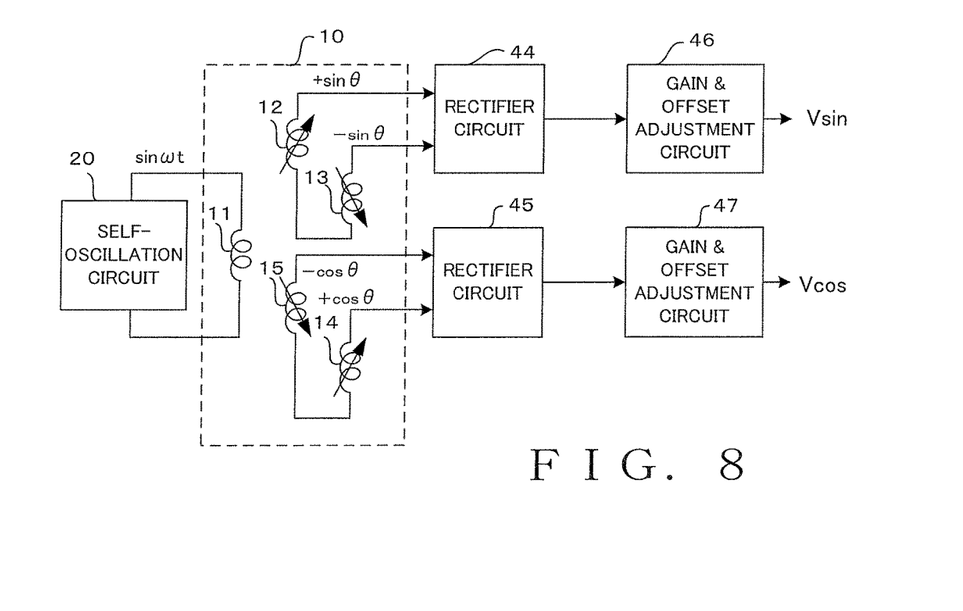
FIG. 8 is a circuit diagram showing still another example circuit construction of the inductive type position detection device according to the present invention.

Further, FIG. 8 is a circuit diagram showing still another example circuit construction of the inductive type position detection device according to the present invention. FIG. 8 shows a modification of the embodiment of FIG. 1. Namely, in the embodiment of FIG. 8, only one primary coil 11 is provided as in the embodiment of FIG. 1 and incorporated as an inductance element in the self-oscillation circuit 20. Of the secondary coils 12 to 15, every two secondary coils of opposite characteristics are connected differentially, as in the embodiment of FIG. 1. More specifically, two secondary coils 12 and 13 of the opposite sine characteristics are connected differentially, and differential output signals of the two secondary coils 12 and 13 are input to a rectifier circuit 44 where a difference between the two differential output signals, i.e. A(θ)−C(θ)=+2 sin θ sin ωt, is rectified to obtain a DC voltage. In this way, a temperature-compensated detection output signal of the sine characteristic is obtained. Further, two secondary coils 14 and 15 of the opposite cosine characteristics are connected differentially, and differential output signals of the two secondary coils 14 and 15 are input to a rectifier circuit 45 where a difference between the two differential output signals, i.e. D(θ)−B(θ)=+2 cos θ sin ωt, is rectified to obtain a DC voltage. In this way, a temperature-compensated detection output signal of the cosine characteristic is obtained. Outputs of the rectifier circuits 44 and 45 are input to gain and offset adjustment circuits 46 and 47, respectively, so that the outputs of the rectifier circuits 44 and 45 are not only adjusted in gain by the gain and offset adjustment circuits 46 and 47 but also offset-adjusted by the gain and offset adjustment circuits 46 and 47 adding (or subtracting) predetermined offset voltages to or from the outputs. Thus, a position detection DC voltage signal V sin of the sine characteristic is obtained from the gain and offset adjustment circuit 46, while a position detection DC voltage signal V cos of the cosine characteristic is obtained from the gain and offset adjustment circuit 47.

FIG. 9 is a view showing still another embodiment in which the inductive type position detection device of the present invention is constructed as a rotational position detection device. FIG. 9(a) shows a primary coil substrate 55 on which the one primary coil 11 is provided by printed wiring. As in each of the above-described embodiments, the primary coil 11 is incorporated as an inductance element (11) in the self-oscillation circuit 20. FIG. 9(b) shows a target substrate 53 on which is provided, by printed wiring, a target pattern 54 comprising curved or bent lines formed of a good electrically conductive substance like copper or aluminum. FIG. 9(c) shows a secondary coil substrate 56 on which are provided the plurality of secondary coils 12 to 15 by printed wiring. As an example, four secondary coils 12C, 13C, 14C and 15C are sequentially arranged, at equal intervals (of 18 degrees), within a 72-degree (one-fifth) range along a circumferential direction of the secondary coil substrate 56. These secondary coils 12C, 13C, 14C and 15C correspond to the secondary coils 12 to 15 shown in FIG. 1, 8 or the like and correspond to the plus sine characteristic +sin θ, plus cosine characteristic +cos θ, minus sine characteristic −sin θ and minus cosine characteristic −cos θ. FIG. 5(d) is a side view of the inductive type position detection device constructed by assembling the individual substrates 53, 55 and 56. Namely, the target substrate 53 is mounted on the rotation shaft 40 to constitute the rotor section that rotates together with the rotation shaft 40 in response to rotation of the target of detection. The primary coil substrate 55 and the secondary coil substrate 56 together constitute the stator section, and the target substrate 53 is rotatably disposed between the primary coil substrate 55 and the secondary coil substrate 56.

Figure 9A:
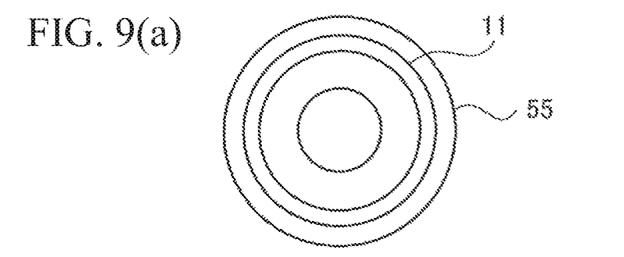
FIGS. 9(a), 9(b), 9(c), and 9(d) are views showing still another embodiment in which the inductive type position detection device of the present invention is constructed as a rotational position detection device.
Figure 9B:
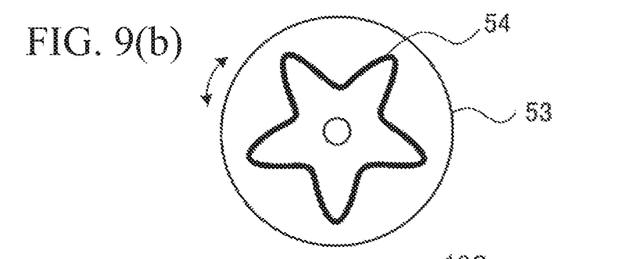
Figure 9C:
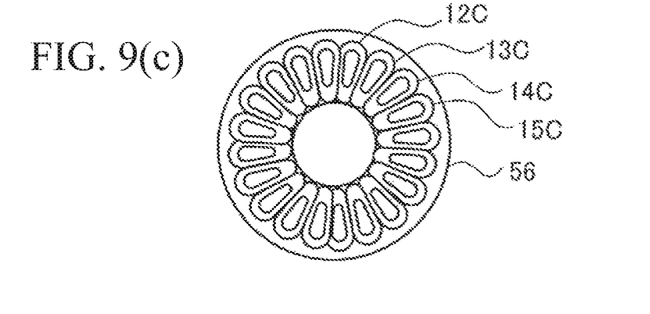
Figure 9D:
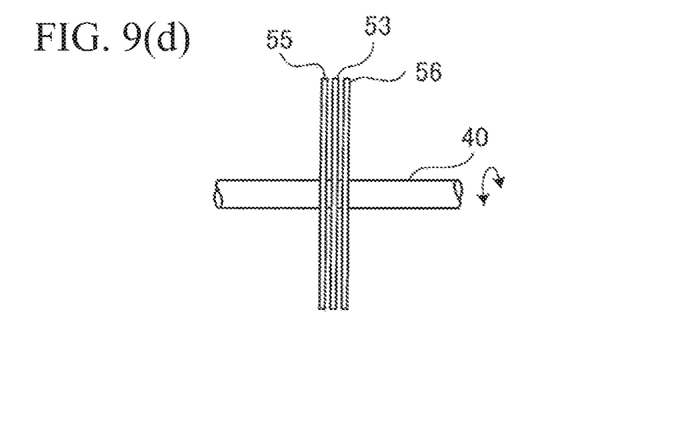

Further, on the secondary coil substrate 56, four sets of secondary coils, each constructed in the same manner as the above-mentioned set of four secondary coils 12C, 13C, 14C and 15C are arranged at equal intervals in the remaining 288-degree range along the circumferential direction. Therefore, a total of five sets of the secondary coils 12C, 13C, 14C and 15C are provided at equal intervals. The target pattern 54 is formed in such a manner as to preset curved variation, i.e. present five (N) cycles of variation characteristics per rotation (360 degrees), in correspondence with an arranged or layout cycle (1/5=1/N rotation) of the five sets (N sets) of the secondary coils 12C, 13C, 14C and 15C. The target pattern 54 formed of a good electrically conductive substance forms a closed loop through which an inductive current flows in response to an AC magnetic field produced by the primary coil 11. The secondary coils 12C, 13C, 14C and 15C couple to a magnetic field produced in response to the inductive current of the target pattern 54, so that inductive currents flow through the secondary coils 12C, 13C, 14C and 15C. Degree of the magnetic coupling of the secondary coils 12C, 13C, 14C and 15C to the target pattern 54 varies in accordance with a position of the target of detection, because of the bent shape of the target pattern 54 (i.e. because an amount of magnetic flux acting on each of the coils varies in accordance with a position of the target of detection. The five cycles (N cycles) of variation of the curved shape of the target pattern 54 cause, in each of the secondary coils 12C, 13C, 14C and 15C, magnetic coupling variation (inductive current variation) responsive to a rotational position of the target pattern 54. In this way, a detection signal corresponding to the rotational position of the target pattern 54 is obtained from each of the secondary coils 12C, 13C, 14C and 15C.

Figure 10:
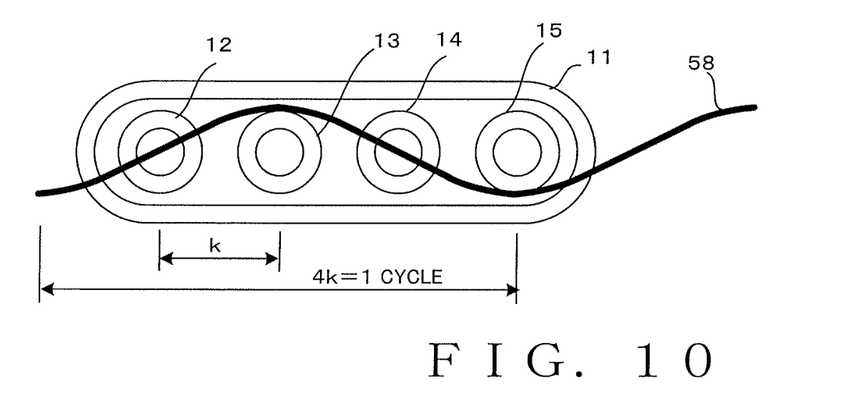
FIG. 10 is a view showing still another embodiment in which the inductive type position detection device of the present invention is constructed as a linear position detection device.

FIG. 10 is a view showing still another embodiment in which the inductive type position detection device of the present invention is constructed as a linear position detection device. This linear position detection device includes: one primary coil 11 and four secondary coils 12 to 15 provided on a coil substrate by printed wiring; and a target pattern 58 of a curved or bent line formed of a good electrically conductive substance provided by wired printing on a target substrate. The target substrate is linearly displaceable relative to the coil substrate. The primary coil 11 is incorporated as an inductance element (11) in the self-oscillation circuit 20, as in each of the other embodiments described above.

The four secondary coils 12, 13, 14 and 15 are sequentially arranged at equal intervals in a relative linearly-displaceable direction of the target pattern 58 and correspond to the plus sine characteristic +sin θ, plus cosine characteristic +cos θ, minus sine characteristic −sin θ and minus cosine characteristic −cos θ as in each of the other embodiments described above. The target pattern 58 in this embodiment is formed in such a manner as to preset curved variation that presents one cycle of a variation characteristic per cycle length 4k of the secondary coils 12, 13, 14 and 15. Let it be assumed that the interval between the adjoining secondary coils 12 and 13 is "k". The target pattern 58 may be set at any desired number of cycles, rather than just one, in accordance a range of linear displacement of the target of detection. For example, in the instant embodiment, the target pattern 58 formed of a good electrically conductive substance is constructed as appropriate to form a closed loop through which an inductive current flows in response to an AC magnetic field produced by the primary coil 11, as in the above-described embodiment of FIG. 9. The secondary coils 12, 13, 14 and 15 couple to a magnetic field produced in response to the inductive current of the target pattern 58, so that inductive currents flow through the secondary coils 12, 13, 14 and 15. Curve-shaped cyclic variation of the target pattern 58 causes, in each of the secondary coils 12, 13, 14 and 15, magnetic coupling variation (inductive current variation) responsive to a linear position of the target pattern 58. In this way, a detection signal corresponding to the linear position of the target of detection is obtained from each of the secondary coils 12, 13, 14 and 15.

The invention claimed is:

1. An inductive type position detection device comprising:
    a coil section including a primary coil excitable by an AC signal and a secondary coil disposed to produce an induced output in response to excitation of the primary coil;
    a self-oscillation circuit composed of the primary coil included in said coil section and a capacitor, said self-oscillation circuit having incorporated therein the primary coil as an inductance element for self-oscillation;
    a target section disposed in such a manner that a position of the target section relative to said coil section varies in response to a position of a target of detection, said target section being formed of a magnetically responsive member constructed to vary inductance of the secondary coil in said coil section in response to the position of the target section relative to said coil section; and
    output circuitry for outputting position data of the target of detection based on an amplitude level of an output signal of the secondary coil.

2. The inductive type position detection device as claimed in claim 1, wherein said self-oscillation circuit has an oscillating frequency set at a high frequency band of hundreds of kHz or more.

3. The inductive type position detection device as claimed in claim 1, wherein said output circuitry includes a rectifier circuit for rectifying the output signal of the secondary coil, and a circuit for offset-adjusting an output DC signal of the rectifier circuit and adjusting a gain of the output DC signal.

4. The inductive type position detection device as claimed in claim 1, wherein the primary and secondary coils each comprise a flat coil formed in a spiral shape on a printed circuit board.

5. The inductive type position detection device as claimed in claim 4, wherein the flat coil constituting the first or second coil includes a plurality of flat coil portions disposed in superposed multiple layers and connected in series with each other.

6. The inductive type position detection device as claimed in claim 1, wherein the secondary coil comprises at least one pair of secondary coils that are disposed spaced from each other by a predetermined interval,
    said target section is constructed in such a manner that inductance variation of individual ones of the pair of secondary coils presents mutually-opposite characteristics, and
    output signals of the pair of secondary coils are differentially synthesized to generate a single synthesized output signal.

7. The inductive type position detection device as claimed in claim 6, wherein the secondary coil comprises two pairs of secondary coils, and
    wherein a synthesized output signal based on one of the pairs of secondary coils presents a sine function characteristic responsive to the position of the target of detection, and a synthesized output signal based on other of the pairs of secondary coils presents a cosine function characteristic responsive to the position of the target of detection.

8. The inductive type position detection device as claimed in claim 1, which is constructed as a rotational position detection device where the target of detection moves in a rotational direction.

9. An inductive type multi-rotational position detection device comprising:
    a first rotational position detection device constructed of an inductive type position detection device;
    a second rotational position detection device constructed of an inductive type position detection device; and
    transmission means for transmitting rotational displacement of the target of detection to said first rotational position detection device and said second rotational position detection device with different transmission ratios,
    wherein the inductive type position detection device comprises:
    a coil section including a primary coil excitable by an AC signal and a secondary coil disposed to produce an induced output in response to excitation of the primary coil;
    a self-oscillation circuit composed of the primary coil included in said coil section and a capacitor, said self-oscillation circuit having incorporated therein the primary coil as an inductance element for self-oscillation;
    a target section disposed in such a manner that a position of the target section relative to said coil section varies in response to a position of a target of detection, said target section being formed of a magnetically responsive member constructed to vary inductance of the secondary coil in said coil section in response to the position of the target section relative to said coil section; and
    output circuitry for outputting position data of the target of detection based on an amplitude level of an output signal of the secondary coil, said inductive type multi-rotational position detection device being capable of detecting absolute positions over a multiplicity of rotations through a combination of detection outputs of said first rotational position detection device and said second rotational position detection device.

10. The inductive type position detection device as claimed in claim 1, which is constructed as a linear position detection device where the target of detection moves in a linear direction.

11. The inductive type position detection device as claimed in claim 1, which is constructed as an inclination detection device where the target of detection moves in an arc.

12. The inductive type position detection device as claimed in claim 1, wherein the magnetically responsive member of said target section is formed of a non-magnetic, good electrically conductive substance and has a curved or bent line shape.

13. The inductive type position detection device as claimed in claim 12, wherein the magnetically responsive member, having the curved or bent line shape, forms a closed loop such that that an inductive current produced by a magnetic field of the primary coil flows therethrough.

\* \* \* \* \*